United States Patent [19]

Quinto et al.

[11] Patent Number: 5,075,181
[45] Date of Patent: Dec. 24, 1991

[54] HIGH HARDNESS/HIGH COMPRESSIVE STRESS MULTILAYER COATED TOOL

[75] Inventors: Dennis T. Quinto, Greensburg, Pa.; Helmut J. Kaufmann, Triesen, Liechtenstein

[73] Assignees: Kennametal Inc., Latrobe, Pa.; Balzers Limited, Liechtenstein

[21] Appl. No.: 348,241

[22] Filed: May 5, 1989

[51] Int. Cl.$^5$ ................... B32B 15/04; C23C 28/04; C23C 16/30

[52] U.S. Cl. ................... 428/698; 51/295; 51/307; 51/309; 428/212; 428/334; 428/469; 428/472; 428/688; 428/689; 428/699; 428/704

[58] Field of Search ............ 428/688, 689, 698, 699, 428/704, 334, 469, 212, 627, 469, 472; 427/37, 38, 39; 51/307, 309, 295

[56] References Cited

U.S. PATENT DOCUMENTS

| | | | |
|---|---|---|---|
| 3,900,592 | 8/1975 | Kennedy et al. | 425/212 |
| 4,035,541 | 7/1977 | Smith et al. | 428/217 |
| 4,101,703 | 7/1978 | Schintlmeister | 428/216 |
| 4,169,913 | 10/1979 | Kobayashi et al. | 428/217 |
| 4,337,300 | 6/1982 | Itaba et al. | 428/627 |
| 4,402,994 | 9/1983 | Kobayashi et al. | 427/38 |
| 4,426,267 | 1/1984 | Munz et al. | 204/192 |
| 4,448,802 | 5/1984 | Buhl et al. | 427/42 |
| 4,497,874 | 2/1985 | Hale | 428/698 |
| 4,507,189 | 3/1985 | Doi et al. | 204/192 |
| 4,720,437 | 1/1988 | Chudo et al. | 428/698 |
| 4,776,863 | 10/1988 | van den Berg et al. | 51/307 |

FOREIGN PATENT DOCUMENTS

| | | |
|---|---|---|
| 0191554 | 8/1986 | European Pat. Off. . |
| 58-157965 | 9/1983 | Japan . |
| 59-39784 | 3/1984 | Japan . |
| 59-18474 | 4/1984 | Japan . |
| 2056564 | 3/1987 | Japan . |
| 62931 | 12/1956 | United Kingdom . |
| 1601224 | 10/1981 | United Kingdom . |

OTHER PUBLICATIONS

Quinto, "Mechanical Property & Structure Relationships in Hard Coatings for Cutting Tools", J. Vac. Sci. Technol., A6(3), May/Jun. 1988, pp. 2149-2157.

Torok et al., "Young's Modulus of Tin, Tic, ZrN, and HfN", Thin Solid Films, 153, (1987), pp. 37-43.

Mehrotra et al., "Compositional & Microhardness Profiles in CVD Coatings with a Ball Wear Scan Technique, Proceedings of the IX Intl. Conf. on CVD", Ed. Robinson et al., Electrochemical Society Inc., (1984), pp. 757-771.

American National Standard for Cutting Tools—Indexable Inserts—Identification (ANSI, B212—1986).

Quino et al., "Mechanical Properties, Structure & Performance of Chemically Vapor-Deposited & Physically Vapor-Deposited Coating Carbide Tools", Materials Sci. & Eng., A105/A106, (1988), pp.443-452.

Jindal et al., "Load Dependence of Microhardness of Hard Coatings", Surface & Coatings Technology, vol. 36, (1988), pp. 683-694.

Jindal et al., "Adhesion Measurements of Chemically Vapor Deposited Hard Coatings on WC-CO Substrates", Thin Solid Films, vol. 54, (1987), pp. 361-375.

Rickerby et al., "Correlation of Process & System Parameters with Structure & Properties of Physically Vapour-Deposited Hard Coatings", Thin Solid Films, vol. 157, (Feb. 1988), pp. 195-222.

(List continued on next page.)

*Primary Examiner*—Ellis P. Robinson
*Assistant Examiner*—Archene Turner
*Attorney, Agent, or Firm*—John J. Prizzi

[57] ABSTRACT

A cutting tool is provided composed of a hard substrate having a PVD coating thereon having three layers. The innermost or first layer is composed of a group IVB (titanium, hafnium or zirconium) metal nitride. The middle or second layer is composed of a group IVB carbonitride. The outermost or third layer is also composed of a group IVB metal nitride. The PVD coating is characterized by high hardness and high residual compressive stresses.

18 Claims, 1 Drawing Sheet

OTHER PUBLICATIONS

Dearnley et al., "Evaluation of Failure Mechanisms of Ceramics & Coated Carbides Used for Machining Stainless Steels", Surface Engineering, vol. 2, No. 3, (1986), pp. 191-202.

Wolfe et al., "The Role of Hard Coatings in Carbide Milling Tools", J. Vac. Sci. Technol., A3, (1986), pp. 2747-2754.

Quinto et al., "High Temperature Microhardness of Hard Coatings Produced by Physical & Chemical Vapor Deposition", Thin Solid Films, vol. 153, (1987), pp. 19-36.

Buhl et al., "Tin Coatings on Steel", Thin Solid Films, vol. 80, (1981), pp. 265-270.

Munz et al., "A High Rate Sputtering Process for the Formation of Hard Friction-Reducing Tin Coatings on Tools", Thin Solid Films, vol. 96, (1982), pp. 79-86.

Komachi et al., "A Comparison of Residual Stresses in Cemented Carbide Cutting Tips Coated with Tin by the CVD & PVD Processes & Their Effect on Failure Resistance", Surfacing Journal Intl., vol. 1, No. 3, (1986), pp. 82-86.

Warrington et al., "Titanium Nitride Coatings by Sputter Ion Plating", Materials & Design, vol. VI, No. 4, Aug./Sep. 1985, pp. 190-195.

Zdanowski et al., "Modification of Metal Properties by Ion Plating of TiN", Vacuum, vol. 36, No. 10, pp. 591-594.

HIGH HARDNESS/HIGH COMPRESSIVE STRESS MULTILAYER COATED TOOL

BACKGROUND OF THE INVENTION

The present invention relates to the field of PVD coated tools.

In the prior art, tool steel and cemented carbide cutting tools have been coated by CVD (chemical vapor deposition) to enhance their cutting lifetime during machining operations. Typical coatings which have been applied are titanium carbide, titanium carbonitride, titanium nitride and alumina. One preferred type of CVD coating is a triphase coating in which a titanium carbide layer is bonded to the substrate, a titanium carbonitride layer is bonded to the titanium carbide layer and then a titanium nitride layer is bonded to the outside of the titanium carbonitride layer (see, for example, E. N. Smith et al U.S. Pat. No. 4,035,541 and W. Schintlmeister U.S. Pat. No. 4,101,703).

PVD (physical vapor deposition) coatings have been applied to tool steel and cemented carbide cutting tools (see, for example, Kobayashi et al U.S. Pat. No. 4,169,913). In the prior art PVD titanium nitride coatings have been commercially applied directly to tool steel and cemented carbide substrates.

European Patent Application Publication No. 0191554 teaches that cemented carbide substrates may be PVD coated with TiC or TiCN if a first PVD TiN coating of between 0.1 and 1 micrometer ($\mu$) is applied in order to avoid diffusion between the carbide of the substrate, the titanium carbide in the PVD coating which leads to a reduction in toughness. It is further taught that a PVD TiN layer should be applied over the PVD TiC or TiCN.

It is known that PVD coatings may be applied to cemented carbide and tool steel substrates by a variety of techniques, such as ion plating, magnetic sputtering and arc evaporation. In addition, each technique has many variations. It has been observed that these various techniques and their variations result in PVD coated tools with a variety of properties. Depending on the exact technique used to deposit the coating, properties such as coating hardness, residual stress, tendency to react or bond to the substrate may positively or adversely be affected. These PVD techniques and the properties of the resulting coatings are described in: Buhl et al, "TiN Coatings on Steel,&38 Thin Solid Films, Vol. 80 (1981) pages 265-270; Buhl et al, U.S. Pat. No. 4,448,802 (foregoing described the Balzers AG ion plating technique and equipment used by the applicants herein); Munz et al, "A High Rate Sputtering Process for the Formation of Hard Friction-Reducing TiN Coatings on Tools," Thin Solid Films, Vol. 96 (1982) pages 79-86; Munz et al U.S. Pat. No. 4,426,267; Kamacki et al, "A Comparison of Residual Stresses in Cemented Carbide Cutting Tips Coated with TiN by the CVD and PVD Processes and Their Effect on Failure Resistance," Surfacing Journal International, Vol. 1, No. 3 (1986) pages 82-86; Wolfe et al, "The Role of Hard Coatings in Carbide Milling Tools," Journal of Vacuum Science Technology, A3 (1986) pages 2747-2754; Quinto et al, "High Temperature Microhardness of Hard Coatings Produced by Physical and Chemical Vapor Deposition," Thin Solid Films, Vol. 153 (1987) pages 19-36; Jindal et al, "Adhesion Measurements of Chemically Vapor Deposited and Physically Vapor Deposited Hard Coatings on WC-Co Substrates," Vol. 54 (1987) pages 361-375; Jindal et al, "Load Dependence of Microhardness of Hard Coatings," Surface and Coatings Technology, Vol. 36 (1988) pages 683-694 (Presented at the 15th International Conference on Metallurgical Coatings, San Diego, Calif., U.S.A., Apr. 11-15, 1988); Rickerby et al, "Correlation of Process and System Parameters with Structure and Properties of Physically Vapour-Deposited Hard Coatings," Thin Solid Films, Vol. 157 (February 1988) pages 195-222 (see pages 200, 201 and 219-221); Quinto et al, "Mechanical Properties, Structure and Performance of Chemically Vapor-Deposited and Physically Vapor-Deposited Coated Carbide Tools," Materials Science and Engineering, A105/106 (1988) pages 443-452 (presented at 3rd International Conference on Science of Hard Materials, Nassau, The Bahamas, Nov. 9-13, 1987).

It is the inventors' opinion that the technique that provides the best PVD coating is that described in the Buhl et al patent and article mentioned above which utilizes the Balzers AG ion plating technology and equipment. This belief is based on their analysis of different types of PVD coated tools which have shown that, in PVD TiN coatings, the highest hardnesses and the highest compressive residual stresses are produced in the Balzers AG ion plated (hereinafter BIP) PVD coating. These properties produce a cutting tool that has higher wear resistance and less susceptibility to edge chipping and breakage than possessed by other PVD coated cutting tools.

However, the high residual compressive stress of the BIP PVD coatings have also produced problems. When the present inventors sought to produce cutting tools having a BIP-PVD TiCN coating thereon, the TiCN coatings produced were susceptible to flaking off. Similar results were observed with BIP-PVD TiC coatings. Analysis of the tools indicated that the BIP-PVD TiCN contained very high compressive residual stresses, perhaps twice as high as that found in BIP-PVD TiN, but no brittle diffusion phases such as reported by the aforementioned European Patent Application. It was, therefore, theorized that this was the cause of the flaking problem. This problem was resolved by first applying a BIP-PVD TiN coating to the surface of the substrate and then applying the BIP-PVD TiCN coating. Tool steel and cemented carbide tools having the foregoing BIP-PVD TiN/TiCN two layer coating have since been publicly disclosed.

It was then desired to apply a further BIP-PVD TiN coating over the BIP-PVD TiN/TiCN coatings described above to provide improved wear resistance and appearance. However, it was not known whether the BIP-PVD TiN could be adherently bonded to the existing BIP-PVD TiCN coating due to the high compressive residual stresses in the various coatings.

SUMMARY OF THE INVENTION

In accordance with the present invention, a cutting tool is provided having a substrate and a coating adherently bonded to it. The substrate may be composed of one of the well known tool steels, cemented carbides or cermets. The coating is deposited by physical vapor deposition and has a first layer composed of a group IVB (titanium, zirconium, hafnium) metal nitride adherently bonded to the substrate, a second layer composed of a group IVB carbonitride adherently bonded to the outside of the first layer, and a third layer also composed of a group IVB metal nitride adherently bonded to the outside of the second layer. The PVD coating in accordance with the present invention is characterized by excellent cracking resistance and abrasion resistance as respectively indicated by a compressive residual stress exceeding 350 kg/mm$^2$ and preferably exceeding 400 kg/mm$^2$, and a Vickers Hardness Number (50 gm load) of 2600-3100 and, preferably, 2750-3100 kg/mm$^2$.

These and other aspects of the invention will become more apparent upon review of the following drawings in conjunction with the detailed specification below:

DETAILED DESCRIPTION OF THE INVENTION

Figure 1:
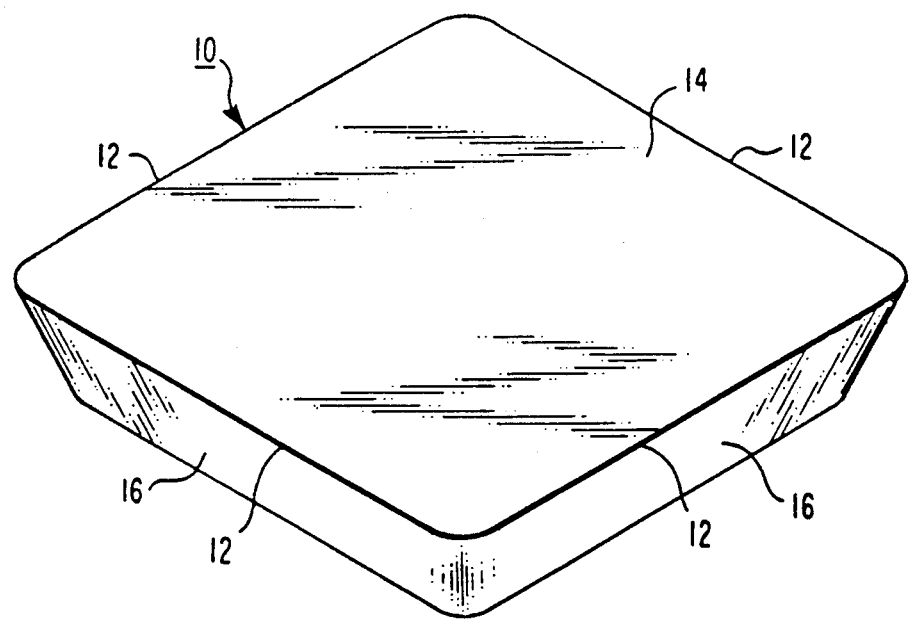
FIG. 1 shows an isometric view of a preferred embodiment of a cutting tool in accordance with the present invention.

In accordance with the present invention a preferred embodiment of a cutting tool, here a SPGN-423 indexable cutting insert body 10, is shown in FIG. 1. The cutting insert body 10 has cutting edges 12 formed at the junction of its rake face 14 and its flank faces 16. The cutting edge 12 preferably is sharp; that is, not honed or chamfered as is customary for CVD coated inserts. The cutting insert 10 has a substrate which is composed of a known hard material such as a tool steel, a cemented carbide or a cermet.

Adherently bonded to the substrate is a PVD coating in accordance with the present invention. Preferably, the entire rake face 14, flank face 16 and cutting edges 12 are coated. For the positive rake style insert shown, the bottom face (not shown) opposite the rake face need not be coated.

The PVD coating is made up of three layers: a first or innermost layer composed of a group IVB (titanium, zirconium, hafnium) metal nitride; a second or middle layer composed of a group IVB metal carbonitride; and an outer or third layer composed of a group IVB metal nitride. Preferably, the first, second and third layers, respectively, have the following composition: TiN/TiC,N/TiN.

In order to assure that the coating and individual layers are adherent to each other and to the substrate, while providing the required amount of wear resistance and fracture resistance, their thickness should be controlled as follows:

For a cutting insert to be used in a milling or other discontinuous cutting operation, the first layer of nitride material preferably has an average thickness of greater than 1$\mu$, but less than about 3$\mu$, and more preferably, between about 1.5 to about 2.5$\mu$. These thicknesses provide assurance that critical areas of the cutting tool (i.e., the cutting edge and nearby flank and rake surfaces) are fully covered by the nitride layer so that the second layer of carbonitride material will not come into direct contact with the substrate. If the second layer should contact the substrate areas with very high compressive residual stresses would form which would be susceptible to flaking off.

The second layer, composed of the carbonitride material, preferably has an average thickness of about 1.2 to about 3$\mu$. While it is desirable to make this carbonitride layer as thick as possible since its hardness and wear resistance is superior to that of the nitride layers, its thickness should not, however, exceed about 3$\mu$ to assure that compressive residual stresses remain high enough to provide the desired fracture toughness for discontinuous cutting operations. Residual compressive stresses decrease as coating thickness increases.

It is further preferred, in order to improve the adherency of the first layer to the second layer, that in the initial portions of the second layer, its carbon content gradually increase to the desired level.

Preferably, the third layer has an average thickness between about 0.2 to about 1.7$\mu$, and more preferably, about 0.5 to less than about 1$\mu$. This third layer provides another layer of wear resistant and high fracture toughness material due to its high hardness and residual compressive stresses. A continuous outer or third layer also provides a low friction surface and provides an appealing gold color to the cutting tool.

Preferably, the overall average thickness of the coating is between about 2.5 to 5$\mu$ for cutting inserts to be used in a milling or other discontinuous cutting operation.

For cutting inserts to be used in a turning, or other continuous cutting operation, the preferred overall coating thickness and layer thicknesses vary as described below from those mentioned above for milling. In a turning operation, where abrasive wear is more of a concern than in milling, it is desired that the overall coating be thicker to provide enhanced abrasive wear resistance. The overall average coating thickness is preferably about 8 to 15$\mu$, more preferably 9 to 12$\mu$, and most preferably about 10$\mu$. Preferably, the inner or first layer is 1 to 4$\mu$ in thickness, and more preferably about 3$\mu$ in thickness. The second layer is preferably 2 to 5$\mu$, and more preferably about 4$\mu$ in thickness. The third layer is preferably about 2 to 3$\mu$, and more preferably about 3$\mu$ in thickness.

The understanding of the present invention will become more clear by consideration of the following example, which is intended to be purely exemplary of the present invention.

An SPGN-423 style indexable insert (see ANSI B212.4-1986) composed of a known, commercial tungsten carbide-cobalt cemented carbide composition containing about 5.7 w/o (weight percent) cobalt, 0.4 w/o chromium and the balance tungsten carbide was selected for use as the substrate. This material is characterized by a Vickers HV 30 hardness of about 1830, a magnetic saturation of about 90 percent, a Hc (coercive force) of about 300 oersteds, a porosity rating of AO4 or better and a Palmqvist Fracture Toughness of about 86 kg/mm. Since this material was being made for test purposes, the ground rake surface was polished. The cutting edges were in a sharp condition. The substrate surfaces (all but the bottom surface) were PVD coated in a Balzers BAI-830 (Balzers AG, Liechtenstein) ion plating PVD coating unit at about 500° C. using a titanium source, a nitrogen atmosphere with acetylene gas being introduced during the carbonitride middle portion of the coating cycle (see U.S. Pat. No. 4,448,802). As is common practice during the initial stage of coating, a very thin layer (detectable only by high resolution TEM) of titanium was deposited on the substrates to provide improved adhesion between the substrate and the titanium nitride first layer. The substrates were moved continuously during the coating cycle.

Figure 2:
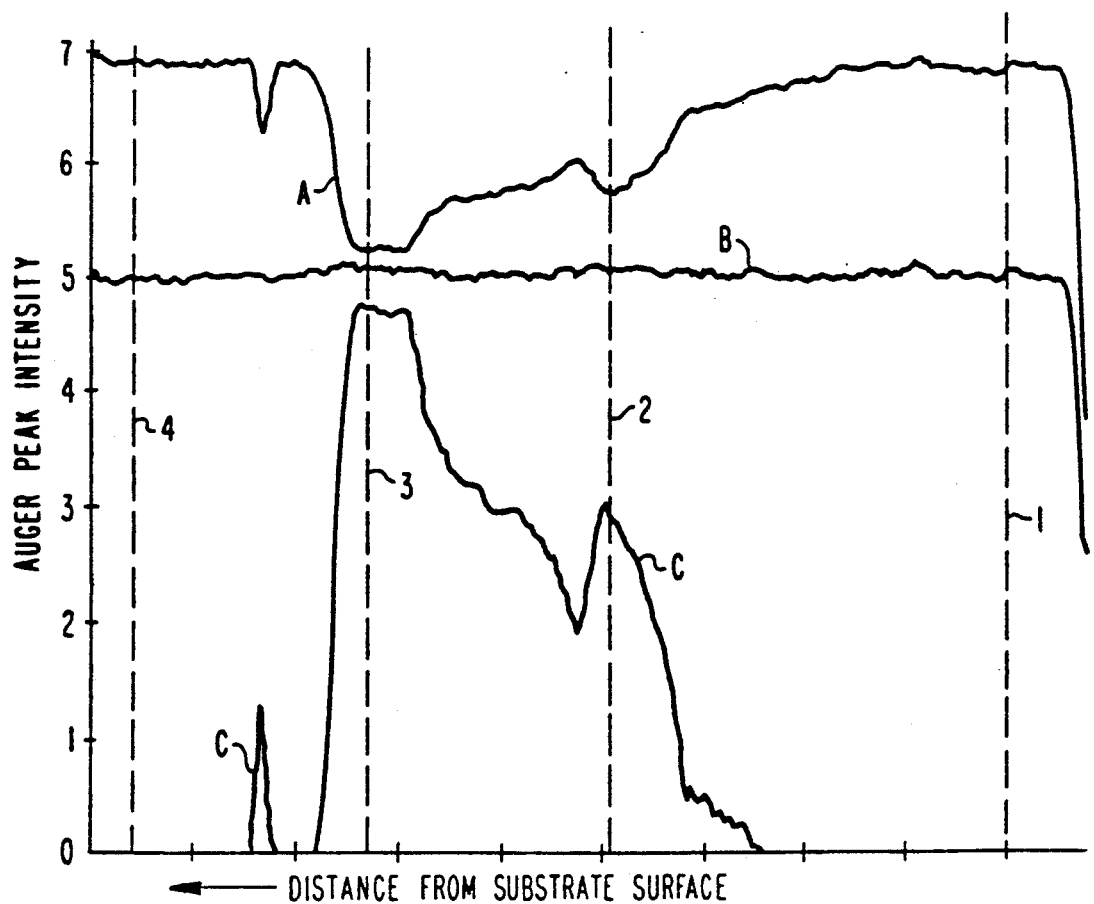
FIG. 2 shows a scanning Auger analysis of the variation in composition of the coating layers from the surface of the substrate to the surface of the coating.

The resulting TiN/TiC,N/TiN coating measured on a first insert had an average inner or first layer thickness of about 1.7μ, an average second layer thickness of about 1.3μ and an average third layer thickness of about 1.5μ. In a second insert which was evaluated, the composition of the second layer varied from just above about 1 atomic percent carbon to about 28.7 atomic percent carbon. FIG. 2 provides a plot of the variation in Auger peak intensity through the coating thickness for: A, the sum of nitrogen and the first titanium peak in the Auger spectrum; B, the second titanium peak in the Auger spectrum; and C, the carbon peak. This data was obtained by a Scanning Auger Line Scan of a ball wear scar using the technique described in Mehrotra et al, "Compositional and Microhardness Profiles in CVD Coatings with a Ball Wear Scar Technique," Proceedings of the IX International Conference on CVD, editors Robinson et al, Electrochemical Society Inc. (1984) pages 757–771. It can be seen in the middle or second layer that the carbon content generally gradually increases as one moves outwardly away from the first and second layer interface until it reached a desired maximum value. The approximate compositions of the coating at positions 1 (first layer 1.3μ thick), 2 (second layer 2.1μ), 3 (second layer) and 4 (third layer 1.5μ) have been calculated from the Auger peak intensities and are reported in Table 1 below in atomic percent. From FIG. 1 and Table 2, it can be seen that the composition of the metal carbonitride in the second layer varies with distance from the substrate, such that, as the second layer extends away from the substrate there is a first maximum (position 2) and then a second maximum (position 3) in the carbon content of the metal carbonitride. The carbon content at the second maximum (position 3) is greater than the carbon content at the first maximum (position 2). Between the first and second maximums, the carbon content of the metal carbonitride reaches a value which is less than that of the first maximum in carbon content (position 2). The carbon levels found at positions 1 and 4, and the oxygen levels at all positions, are normal residual amounts observed on Auger samples. The minor carbon peak and corresponding nitrogen dip in the outer TiN layer are believed to be artifacts caused by a local pore on the surface examined.

TABLE 1

| | COATING COMPOSITION | | | |
| --- | --- | --- | --- | --- |
| | Position | | | |
| Element | 1 | 2 | 3 | 4 |
| C | 1.2 | 17.5 | 28.7 | 2.1 |
| N | 54.7 | 33.8 | 20.9 | 52.8 |
| Ti | 43.9 | 48.3 | 51.0 | 44.7 |
| O | 0.2 | 0.4 | 0.5 | 0.5 |

The coatings were further characterized as to hardness and adhesion. The coating had a Vickers Hardness Number (at 50 gm load) of about 2840 kg/mm$^2$. Adhesion of the coating as measured by the Scratch Adhesion Critical Load, Lc, (newtons) and by the Indent Adhesion Critical Load, Pcr, (Kg) are satisfactory and are respectively >90 and >45. Fracture cross sections through the coating thickness show that the coating has a dense pore free structure.

It is generally known that higher compressive residual stresses in PVD hard coatings are associated with a higher measured microhardness. (See FIG. 9 of Quinto, "Mechanical Property and Structure Relationships in Hard Coatings for Cutting Tools," J. Vac. Sci. Technology, A6(3) May/June 1988, pages 2149–2157.) Although the elastic modulus, E, needed to calculate residual stress is not known for TiCN, it is reasonable to assume that the higher microhardness (relative to PVD TiN, approximately 2400 kg/mm$^2$) of PVD TiCN also has higher compressive residual stress, calculated here with the assumed E value for TiN of 640 GPa (Torok et al, "Young's Modulus of TiN, TiC, ZrN and HfN," Thin Solid Films, Vol. 153 (1987) pages 37–43 (see page 42)). The measurement of residual stress by x-ray diffraction "sin$^2\psi$ method" is described in Quinto et al, Thin Solid Films 153 (1987) page 21.

In our estimation, based on residual stress measurements made in BIP-PVD TiN coatings, the residual stress in the coating according to the present invention is believed to exceed about 400 Kg/mm$^2$.

All applications, patents and other documents referred to herein are hereby incorporated by reference.

Other embodiments of the invention will be apparent to those skilled in the art from a consideration of this specification or practice of the invention disclosed herein. It is intended that the specification and examples be considered as exemplary only, with the true scope and spirit of the invention being indicated by the following claims.

What is claimed is:

1. A cutting tool comprising:
   a body having a first face and a second face;
   a cutting edge located at the junction of said first face and said second face;
   said body composed of a substrate and a coating adherently bonded to said substrate;
   said substrate composed of a hard material selected from the group consisting of tool steels, cemented carbides and cermets;
   said coating having a first layer composed of a group IVB metal nitride deposited by physical vapor deposition and adherently bonded to said substrate;
   said coating have a second layer composed of a group IVB metal carbonitride deposited by physical vapor deposition and adherently bonded to the outside of said first layer;
   said coating having a third layer composed of a group IVB metal nitride deposited by physical vapor deposition and adherently bonded to the outside of said second layer;
   wherein said coating contains an average compressive residual stress exceeding about 350 Kg/mm$^2$;
   wherein said coating has an average Vickers Hardness Number (50 gm/load) between about 2600 to 3100 kg/mm$^2$;
   and wherein said first layer has a thickness exceeding 1 micrometer but which is less than 3 micrometers.

2. The cutting tool according to claim 1 wherein said compressive residual stress exceeds about 400 Kg/mm$^2$.

3. The cutting tool according to claim 2 wherein said first layer has a thickness of about 1.5 to about 2.5 micrometers.

4. The cutting tool according to claim 1 wherein said substrate is cemented carbide.

5. The cutting tool according to claim 1 wherein said layer is composed of titanium nitride.

6. The cutting tool according to claim 3 wherein said third layer is composed of titanium nitride.

7. The cutting tool according to claim 1 wherein said second layer is composed of titanium carbonitride and said first layer is composed of titanium nitride.

8. The cutting tool according to claim 8 wherein said second layer is composed of titanium carbonitride and said first layer is composed of titanium nitride.

9. The cutting tool according to claim 1 wherein said average Vickers Hardness Number is about 2750 to 3100 kg/mm$^2$.

10. The cutting tool according to claim 9 wherein said first layer has a thickness of about 1.5 to about 2.5 micrometers.

11. The cutting tool according to claim 9 wherein said substrate is cemented carbide.

12. The cutting tool according to claim 9 wherein said third layer is composed of titanium nitride.

13. The cutting tool according to claim 10 wherein said third layer is composed of titanium nitride.

14. The cutting tool according to claim 9 wherein said second layer is composed of titanium carbonitride and said first layer is composed of titanium nitride.

15. The cutting tool according to claim 12 wherein said second layer is composed of titanium carbonitride and said first layer is composed of titanium nitride.

16. The cutting tool according to claim 15 wherein said coating is characterized by an average compressive residual stress exceeding 400 kg/mm$^2$.

17. A cutting tool comprising:
a body having a first face and a second face;
a cutting edge located at the junction of said first face and said second face;
said body composed of a substrate and a coating adherently bonded to said substrate;
said substrate composed of a hard material selected from the group consisting of tool steels, cemented carbides and cermets;
said coating having a first layer composed of a group IVB metal nitride deposited by physical vapor deposition and adherently bonded to said substrate;
said coating having a second layer composed of a group IVB metal carbonitride deposited by physical vapor deposition and adherently bonded to the outside of said first layer;
said coating having a third layer composed of a group IVB metal nitride deposited by physical vapor deposition and adherently bonded to the outside of said second layer;
wherein said coating has an average Vickers Hardness Number (50 gm/load) between about 2600 and 3100 Kg/mm$^2$;
wherein said coating contains an average compression residual stress exceeding about 350 Kg/mm$^2$;
wherein the compositions of the metal carbonitride in the second layer varies with distance from the substrate, such that as the second layer extends away from the substrate there is a first maximum and then a second maximum in the carbon content of the metal carbonitride and wherein between said first and second maximum, the carbon content of said metal carbonitride reaches a value which is less than the first maximum in carbon content.

18. The cutting tool according to claim 17 wherein the carbon content at the second maximum is greater than the carbon content at the first maximum.

* * * * *

UNITED STATES PATENT AND TRADEMARK OFFICE
CERTIFICATE OF CORRECTION

PATENT NO. : 5,075,181

DATED : December 24, 1991

INVENTOR(S) : Dennis T. Quinto and Helmut J. Kaufmann

It is certified that error appears in the above-identified patent and that said Letters Patent is hereby corrected as shown below:

column 1, line [56], following "2056564 3/1987 Japan" withdraw "62931" and replace by --762931-- column 2, line 3, withdraw "Tin, Tic, " and replace by --TiN, TiC,-- column 2, line 6, withdraw "Scan" and replace by --Scar-- column 2, line 11, withdraw "B212" and replace by --B212.4-- column 2, line 20, withdraw "CO" and replace by --Co-- column 1, line 12, withdraw "Tin" and replace by --TiN-- column 2, line 2, withdraw "Tin" and replace by --TiN-- column 2, line 5, withdraw "Tin" and replace by --TiN--

Column 1, line 48, withdraw "&38" and replace by --."--

Column 3, line 45, after "TiN/" withdraw -- - --

Column 6, line 39 (Claim 1, line 13) withdraw "have" and replace by --having--

UNITED STATES PATENT AND TRADEMARK OFFICE
CERTIFICATE OF CORRECTION

PATENT NO. : 5,075,181

DATED : December 24, 1991

INVENTOR(S) : Dennis T. Quinto and Helmut J. Kaufmann

It is certified that error appears in the above-identified patent and that said Letters Patent is hereby corrected as shown below:

Column 6, line 63 (Claim 5, line 2) before "layer" insert --third--

Signed and Sealed this

First Day of June, 1993

Attest:

MICHAEL K. KIRK

Attesting Officer

Acting Commissioner of Patents and Trademarks